US012538507B2

(12) United States Patent
John et al.

(10) Patent No.: US 12,538,507 B2
(45) Date of Patent: Jan. 27, 2026

(54) SEMICONDUCTOR DEVICE HAVING AN EXTRINSIC BASE REGION WITH A MONOCRYSTALLINE REGION AND METHOD THEREFOR

(71) Applicant: NXP B.V., Eindhoven (NL)

(72) Inventors: Jay Paul John, Chandler, AZ (US); James Albert Kirchgessner, Tempe, AZ (US); Johannes Josephus Theodorus Marinus Donkers, Valkenswaard (NL); Ljubo Radic, Gilbert, AZ (US)

(73) Assignee: NXP B.V., Eindhoven (NL)

( * ) Notice: Subject to any disclaimer, the term of this patent is extended or adjusted under 35 U.S.C. 154(b) by 441 days.

(21) Appl. No.: 18/067,322

(22) Filed: Dec. 16, 2022

(65) Prior Publication Data

US 2024/0204086 A1    Jun. 20, 2024

(51) Int. Cl.
| | | |
|---|---|---|
| *H10D 10/80* | (2025.01) | |
| *H10D 10/01* | (2025.01) | |
| *H10D 62/10* | (2025.01) | |
| *H10D 62/13* | (2025.01) | |
| *H10D 62/17* | (2025.01) | |
| *H10D 62/40* | (2025.01) | |
| *H10D 62/832* | (2025.01) | |

(52) U.S. Cl.
CPC ......... *H10D 10/821* (2025.01); *H10D 10/021* (2025.01); *H10D 62/115* (2025.01); *H10D 62/133* (2025.01); *H10D 62/138* (2025.01); *H10D 62/177* (2025.01); *H10D 62/40* (2025.01); *H10D 62/832* (2025.01)

(58) Field of Classification Search
CPC ..... H10D 10/821; H10D 10/021; H10D 10/80
See application file for complete search history.

(56) References Cited

U.S. PATENT DOCUMENTS

| | | | |
|---|---|---|---|
| 5,962,880 A | * | 10/1999 | Oda .................... H10D 62/177 |
| | | | 250/214 A |
| 6,870,184 B2 | | 3/2005 | Li et al. |
| 7,074,685 B2 | | 7/2006 | Magnee et al. |
| 7,521,772 B2 | | 4/2009 | Adam et al. |

(Continued)

FOREIGN PATENT DOCUMENTS

EP   3843159 A1   6/2021

OTHER PUBLICATIONS

U.S. Appl. No. 18/059,849; Inventor Ljubo Radic, et al.; "Semiconductor Device With a Monocrystalline Extrinsic Base and Method Therefor;", filed Nov. 29, 2022.

*Primary Examiner* — Syed I Gheyas
(74) *Attorney, Agent, or Firm* — Bruce M. Green

(57) ABSTRACT

A semiconductor device includes a semiconductor substrate, a collector region having a first width formed within the semiconductor substrate and an intrinsic base region having a second width, disposed over the collector region, wherein the first width is greater than the second width. An extrinsic base region having an upper surface is formed over the collector region and electrically coupled to the intrinsic base region, wherein the extrinsic base region includes a monocrystalline region coupled to the intrinsic base region and a polycrystalline region coupled to the monocrystalline region. An emitter region is formed over the base region.

20 Claims, 6 Drawing Sheets

(56) References Cited

U.S. PATENT DOCUMENTS

| | | | |
|---|---|---|---|
| 8,431,966 | B2 | 4/2013 | Meunier-Beillard et al. |
| 8,786,051 | B2 | 7/2014 | Adkisson et al. |
| 9,111,986 | B2 | 8/2015 | Camillo-Castillo et al. |
| 9,240,448 | B2 | 1/2016 | Adkisson et al. |
| 11,018,247 | B1 * | 5/2021 | Radic .................. H10D 62/115 |
| 2004/0126978 | A1 * | 7/2004 | Kalnitsky ............ H10D 10/021 |
| | | | 257/E21.696 |
| 2005/0001238 | A1 * | 1/2005 | Oue .................... H10D 10/054 |
| | | | 257/E29.184 |
| 2012/0001192 | A1 | 1/2012 | Fox et al. |
| 2013/0214275 | A1 | 8/2013 | Adkisson et al. |
| 2014/0361300 | A1 | 12/2014 | Camillo-Castillo et al. |

* cited by examiner

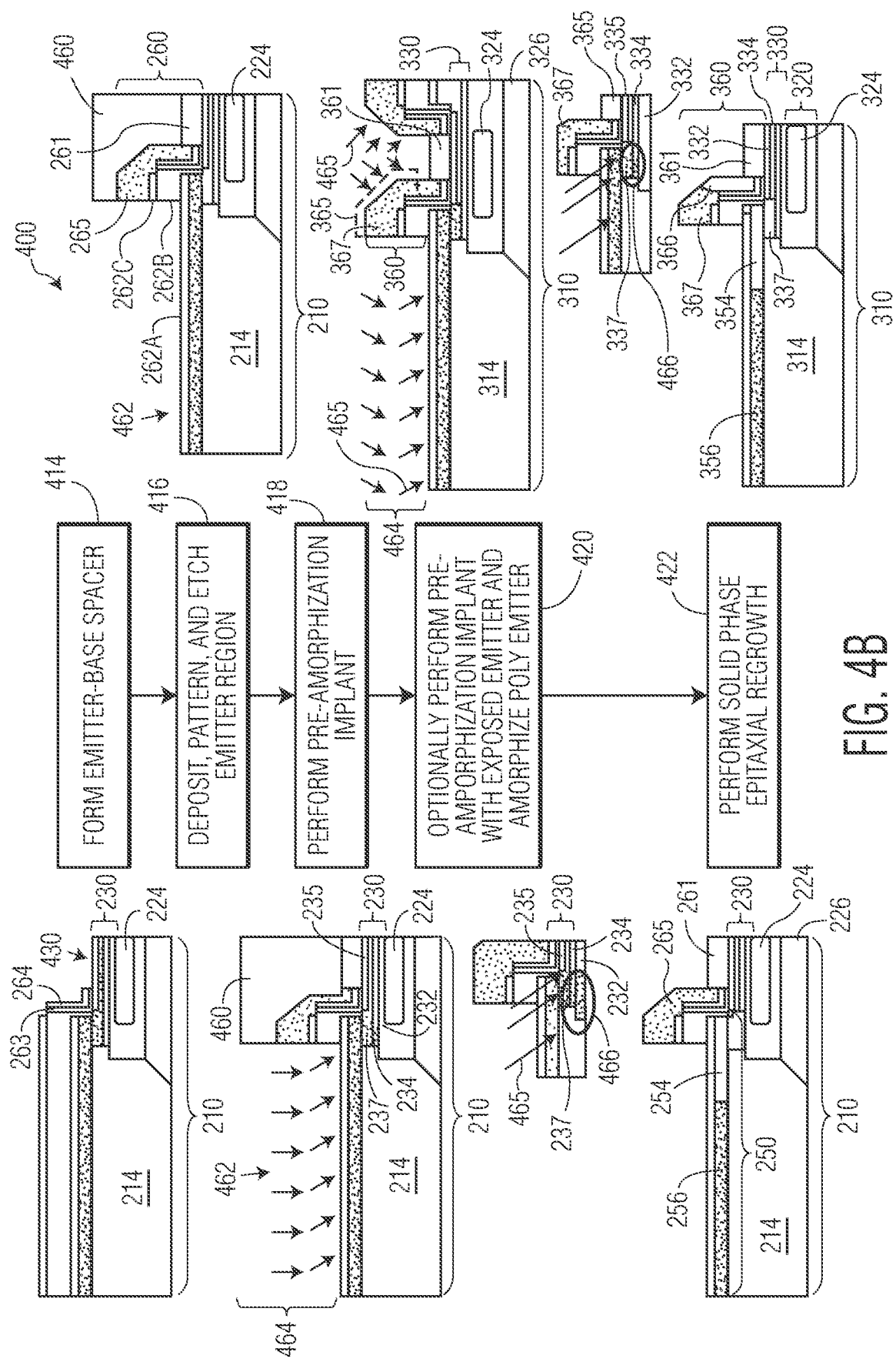

025 US 12,538,507 B2

SEMICONDUCTOR DEVICE HAVING AN EXTRINSIC BASE REGION WITH A MONOCRYSTALLINE REGION AND METHOD THEREFOR

TECHNICAL FIELD

Embodiments of the subject matter described herein relate generally to semiconductor devices, including bipolar junction transistors (BJT's) and heterojunction bipolar transistors (HBT's).

BACKGROUND

Semiconductor devices find application in a wide variety of electronic components and systems. Moreover, useful semiconductor devices for radio frequency (RF), microwave, and millimeter wave applications may include BJTs, HBTs, and related devices. HBTs are useful in high frequency applications because of their fast transit time, high cutoff frequency, high gain, and good linearity properties. These HBTs act as active gain elements and find applications as active devices in RF, microwave and millimeter wave power amplifiers, oscillators, and other useful electronic components. In these and other applications for these devices, there is a need for reduced base resistance. Reduced base resistance is important for achieving higher maximum frequency of oscillation ($f_{max}$) and improved frequency response for these applications. The value of $f_{max}$ is inversely proportional to base resistance ($R_b$). Thus, semiconductor devices, including BJTs and HBTs, with reduced $R_b$ are desired.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 4A, 4B, and 4C are a process flow diagrams with corresponding cross-sectional views describing a method for fabricating the semiconductor devices, in accordance with the embodiments of FIGS. 2 and 3.

SUMMARY

Figure 1:
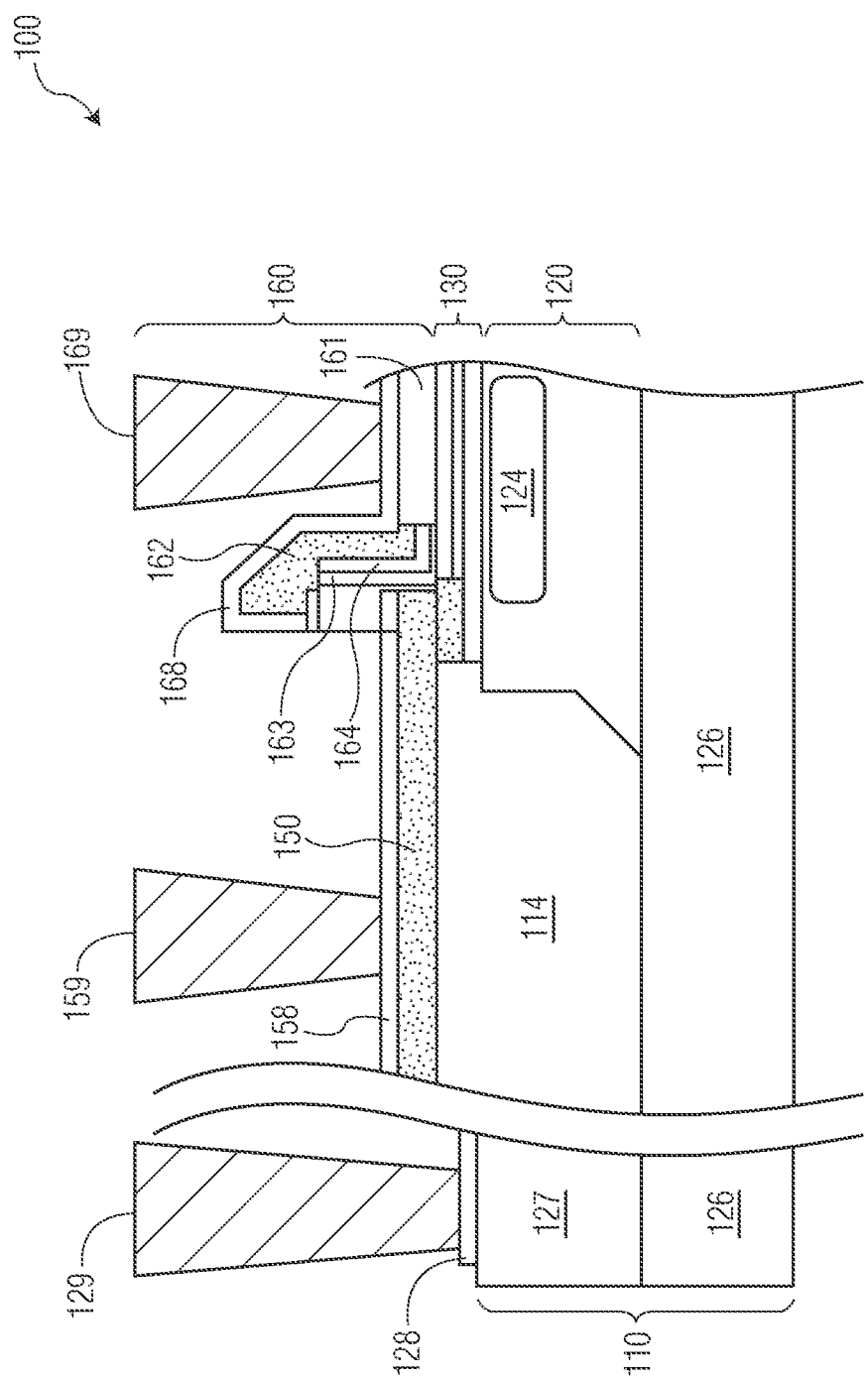
FIG. 1 is a cross sectional side view of a semiconductor device.

In one aspect, an embodiment of a semiconductor device may include a semiconductor substrate and a collector region having a first width formed within the semiconductor substrate, wherein the collector region may have an upper surface and a collector sidewall, an intrinsic base region having a second width, disposed over the collector region, wherein the first width may be greater than the second width an extrinsic base region having an upper surface and formed over the collector region and electrically coupled to the intrinsic base region, wherein the extrinsic base region may include a monocrystalline region coupled to the intrinsic base region and a polycrystalline region coupled to the monocrystalline region, according to an embodiment. An emitter region may be formed over the intrinsic base region, according to an embodiment.

A contact layer may be formed above the extrinsic base region, according to an embodiment.

In an embodiment, a portion of the monocrystalline region may be formed under the contact layer.

A portion of the intrinsic base region may be formed in a base cavity formed over the collector region and under the extrinsic base region, according to an embodiment.

A base link region formed within the base cavity may be monocrystalline and may be coupled to the monocrystalline region of the extrinsic base region, according to an embodiment.

An extrinsic portion of the emitter region may be formed over an emitter spacer layer, wherein a portion of the extrinsic portion of the emitter region may be monocrystalline.

A portion of the intrinsic base region may include selective epitaxy, according to an embodiment.

A portion of the intrinsic base region may include silicon germanium, according to an embodiment.

In another aspect, an embodiment may include a bipolar transistor device that comprises a semiconductor substrate, a first isolation region formed within the semiconductor substrate, a collector region having a first width formed within the semiconductor substrate, wherein the collector region may have an upper surface and a collector sidewall. An intrinsic base region having a second width may be disposed over the collector region, wherein the first width may be greater than the second width, according to an embodiment. A dielectric region may be formed over at least a portion of the semiconductor substrate and over the collector sidewall, according to an embodiment. In an embodiment, a region having a second width may be disposed over the collector region, wherein the first width may be greater than the second width. An extrinsic base region having an upper surface may be formed over the collector region and may be electrically coupled to the intrinsic base region, wherein the extrinsic base region includes a monocrystalline region may be coupled to the intrinsic base region, according to an embodiment. In an embodiment, a polycrystalline region may be coupled to the monocrystalline region. An emitter region may be formed over the intrinsic base region, according to an embodiment.

A portion of the intrinsic base region may be formed in a base cavity formed over the collector region and under the extrinsic base region, according to an embodiment.

In an embodiment, a portion of a base link region may be formed within the base cavity is monocrystalline and is coupled to the monocrystalline region of the extrinsic base region.

An extrinsic portion of the emitter region may be formed over an emitter spacer layer, wherein a portion of the extrinsic portion of the emitter region may be monocrystalline, according to an embodiment.

In another aspect, an embodiment may include a method of forming a bipolar transistor device. An embodiment of the method may include forming an isolation region within a semiconductor substrate, forming a collector region having a first width laterally adjacent the isolation region within the semiconductor substrate, wherein the collector region may include an upper surface and a collector sidewall, forming an intrinsic base region having a second width over the collector region, forming a dielectric region over at least a portion of the semiconductor substrate and over the collector sidewall, forming an extrinsic base region having an upper surface over the collector region, wherein the extrinsic base region may be electrically coupled to the intrinsic base region. Forming the extrinsic base region may include forming a monocrystalline region coupled to the intrinsic base region and forming a polycrystalline region coupled to the monocrystalline region, according to an embodiment of the method. In an embodiment, the method may include forming an emitter region over the intrinsic base region.

An embodiment of the method may include forming an emitter region over the intrinsic base region that may include forming an extrinsic portion of the emitter region over an emitter spacer layer, and wherein a portion of the extrinsic portion of the emitter region may be monocrystalline.

An embodiment of the method may include forming a contact layer above the extrinsic base region, wherein forming the contact layer includes forming a portion of the contact layer over the monocrystalline region.

An embodiment of the method may include forming a base cavity and forming the intrinsic base region and a base link region in the base cavity, wherein a portion of the base link region is monocrystalline.

An embodiment of the method may include performing a pre-amorphization implant to form the monocrystalline region.

An embodiment of the method may include forming the monocrystalline region using solid-phase regrowth.

An embodiment of the method may include forming an emitter spacer layer and forming an extrinsic portion of the emitter region over the emitter spacer layer.

In an embodiment of the method, forming the extrinsic portion of the emitter region may include forming a monocrystalline material within the extrinsic portion of the emitter region.

DETAILED DESCRIPTION

FIG. 1 is a cross sectional side view of a bipolar transistor device 100 (i.e., "semiconductor device"). According to an embodiment, the bipolar transistor device 100 may include a semiconductor substrate 110, a collector region 120 formed within the semiconductor substrate 110, a base region 130 disposed over the collector region 120, an extrinsic base region 150 coupled to the base region 130, and an emitter region 160 formed over the base region 130. As with other figures presented herein, FIG. 1 depicts a symmetric half of the bipolar transistor device 100. A full view of bipolar transistor device 100 may be realized by mirroring the depicted elements of the bipolar transistor device 100 about a vertical axis of the emitter region 160.

Referring again to FIG. 1, and in an embodiment, the semiconductor substrate 110 may include a number of semiconductor regions. As used herein, the term, "semiconductor region" may refer to single or multiple semiconductor regions that may include regions formed by implantation (e.g., ion implantation) or layers grown by epitaxial growth. In an embodiment, the collector region 120 may be formed within the semiconductor substrate 110. A base region 130 may be formed over and in contact with the collector region 120. An extrinsic base region 150 is typically used to couple the base region 130 to a base electrode 159 through a base contact layer 158.

In the bipolar transistor device 100, the semiconductor substrate 110 typically includes include silicon (Si), carbon (C) and/or germanium (Ge). In the bipolar transistor device 100, the collector region 120 is formed in an upper portion of the semiconductor substrate 110. The base region 130 is typically formed over the collector region 120. The collector region 120, the base region 130, and the emitter region 160 may include one or more of Si, C and/or Ge. The bipolar transistor device 100 is typically configured as a npn transistor such that collector region 120 and the emitter region 160 include a n-type semiconductor and the base region 130 includes a p-type semiconductor. The collector region 120 is typically formed within the semiconductor substrate 110. The collector region includes a selectively implanted collector (SIC) region 124. A sub-collector region 126 is typically formed below the collector region 120 within the semiconductor substrate 110 and is used to provide an electrical path to a collector electrode 129 through a sub-contact region 127 and a contact layer 128. The sub-collector region 126 and sub-contact region 127 is typically doped at a higher level than the doping concentration of the collector region 120. A dielectric region 114 is typically formed in openings formed adjacent collector region 120 and is used to provide isolation between devices.

In the bipolar transistor device 100, the base region 130 is typically formed over the collector region 120. The base region 130 is typically formed using Si or a mixed crystal alloy of Si and Ge, SiGe. In a conventional npn device, the base region 130 is formed using a p-type semiconductor. The base region 130 is typically doped with boron (B). In pnp bipolar transistor devices the base region 130 is formed using an n-type semiconductor. The extrinsic base region 150 may be formed over the semiconductor substrate 110 and dielectric region 114 and provides a low resistance connection to the base electrode 159 through base contact layer 158. In some bipolar transistor devices, the extrinsic base region 150 may be formed using polycrystalline material since it is formed in contact with dielectric region 114 and there is no single crystal or monocrystalline semiconductor material to form the extrinsic base using monocrystalline material. For example, the effective hole mobility of polycrystalline Si is limited to value of between about 5-20 $cm^2$/V-s, compared to monocrystalline Si which has a mobility between about 50-200 $cm^2$/V-s. The extrinsic base poly is typically formed using silicon or silicon germanium. Because of this, the value of the base resistance, $R_b$, for the bipolar transistor device 100 of FIG. 1 may be limited. The maximum frequency of oscillation, $f_{max}$, which is approximated by $f_{max} \sim [f_T/(8\pi R_b C_{bc})]^{1/2}$ where $R_b$ is the base resistance, $f_T$ is the unity gain cutoff frequency, and $C_{bc}$ is the base-collector capacitance may be limited by the value of $R_b$ in bipolar transistor device 100.

In the bipolar transistor device 100, the emitter region 160 may be formed over the base region 130. According to an embodiment, the emitter region 160 may include an intrinsic emitter region 161, an extrinsic emitter region 162, a first emitter spacer layer 163, a second emitter spacer layer 164, and an emitter contact layer 168 formed over the intrinsic emitter region 161. The emitter region 160 may also include an emitter electrode 169 formed over the emitter contact layer 168.

Figure 2:
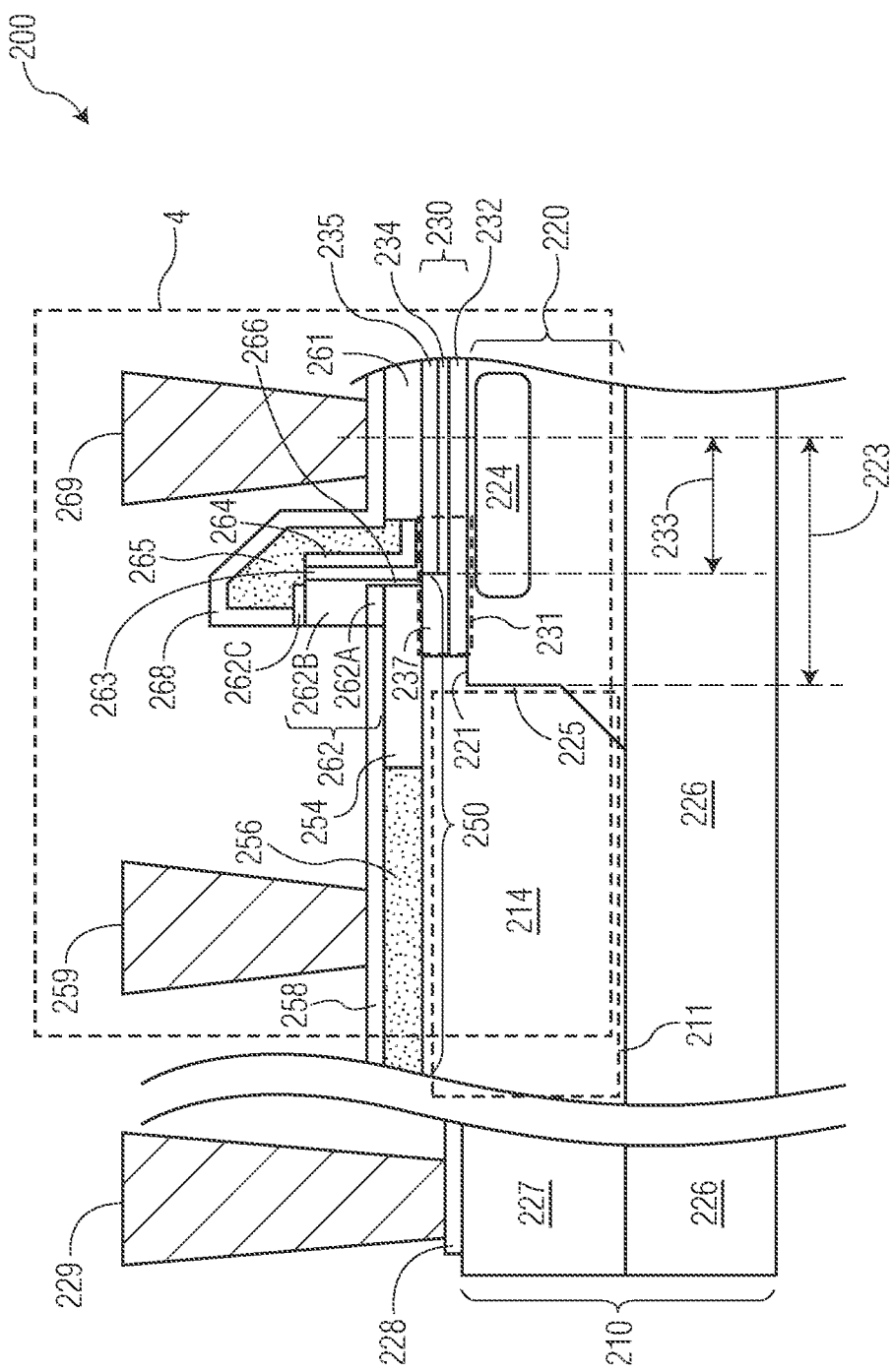
FIG. 2 is a cross sectional side view of a semiconductor device in accordance with an embodiment.

FIG. 2. is a cross sectional side view of a bipolar transistor device 200, according to an embodiment. In an embodiment, bipolar transistor device 200 may include a semiconductor substrate 210, dielectric region 214 that includes first isolation region 211 formed within the semiconductor substrate 210, a collector region 220 having a first width 223 may be formed within the semiconductor substrate 210, having an upper surface 221 and a collector sidewall 225, according to an embodiment. An intrinsic base region having a second width 233, disposed over the collector region, wherein the first width 223 is greater than the second width 233, and wherein a portion of the intrinsic base region 230 may be formed over the collector region 220, according to an embodiment. A portion of the intrinsic base region 230 may be formed within a base cavity 231, according to an embodiment. In an embodiment, a dielectric region 214 may be formed over at least a portion of the semiconductor substrate 210 and over the collector sidewall 225. The intrinsic base region 230 may have a second width 233 and may be disposed over the collector region 220, wherein the first width 223 may be greater than the second width 233, according to an embodiment. In an embodiment, an extrinsic base region 250 may be formed over the collector region 220 and electrically coupled to the intrinsic base region 230. The extrinsic base region 250 may include a monocrystalline region 254 coupled to the intrinsic base region 230 and a polycrystalline region 256 coupled to the monocrystalline region 254. An emitter region 260 may be formed over the intrinsic base region 230, according to an embodiment.

Referring again to FIG. 2, and in an embodiment, the semiconductor substrate 210 may include one or more of silicon (Si), germanium (Ge), silicon germanium (SiGe), gallium arsenide (GaAs), gallium phosphide (GaP), indium gallium phosphide (InGaP), indium phosphide (InP), gallium nitride (GaN), aluminum nitride (AlN), indium nitride (InN), silicon carbide (SIC), sapphire, or other suitable materials. In other embodiments, the semiconductor substrate 210 may include Si on insulator (SOI). In an embodiment, the collector region 220 may be formed in an upper portion of the semiconductor substrate 210. The intrinsic base region 230 may be formed over the collector region 220, according to an embodiment. In an embodiment, the collector region 220, the intrinsic base region 230, and the emitter region 260 may include one or more of Si, Ge, SiGe and SiGe:C. In other embodiments, the collector region 220, the intrinsic base region 230, and the emitter region 260 may include one or more of GaAs, GaN, AlN, InN, InGaP, and/or other suitable materials. In an embodiment, the bipolar transistor device 200 may be configured as a npn transistor such that the collector region 220 and the emitter region 260 include a n-type semiconductor and the intrinsic base region 230 include a p-type semiconductor. In other embodiments, the bipolar transistor device 200 may be configured as a pnp transistor such that the collector region 220 and the emitter region 260 include a p-type semiconductor and the intrinsic base region 230 includes a n-type semiconductor. As used herein, the term "p-type semiconductor" refers to a semiconductor material with a hole concentration ranging from about 1e15 cm$^{-3}$ to about 1e20 cm$^{-3}$, though other higher or lower hole concentrations may be included. As used herein, the term "n-type semiconductor" refers to a semiconductor material with a net electron concentration ranging from about 1e15 cm$^{-3}$ to about 1e20 cm$^{-3}$, though other higher or lower electron concentrations may be used.

In an embodiment, the collector region 220 may be formed within the semiconductor substrate 210. According to an embodiment, the collector region 220 may include an upper surface 221, a collector sidewall 225. The dielectric region 214 (i.e., "isolation region") provides device to device isolation and separates the collector sidewall 225 from other regions of the device. A SIC region 224 may be formed in an upper portion of the collector region 220, according to an embodiment. In some embodiments (e.g., npn transistor device), the collector region 220 may be formed using a n-type semiconductor. In other embodiments (pnp transistor device), the collector region 220 may be formed using a p-type semiconductor. In an embodiment, the collector region 220 may have a thickness of between about 400 angstroms and 4000 angstroms. In other embodiments, the collector region 220 may have a thickness between about 100 angstroms and about 10000 angstroms, though other thicknesses may be used. In an embodiment, the SIC region 224 may have a thickness of between about 200 angstroms and 2000 angstroms. In other embodiments, the SIC region 224 may have a thickness between about 50 angstroms and about 5000 angstroms, though other thicknesses may be used. In embodiments that include a n-type collector region (e.g., npn transistors), the collector region 220 may be doped with one or more of phosphorous (P), arsenic (As), antimony (Sb), lithium (Li) or other suitable dopants. In embodiments that include a p-type collector region 220 (e.g., pnp transistors), the collector region 220 may be doped with one or more of carbon (C), boron (B), oxygen (O), or indium (In) though other dopant species may be used. The doping concentration of the SIC region 224 may be in a range of 5e16 cm$^{-3}$ to 5e18 cm$^{-3}$ though other higher or lower dopant concentrations may be used. According to an embodiment, a sub-collector region 226 may be formed below the collector region 220 within the semiconductor substrate 210 and provides a low resistance connection to the collector electrode 229 through a sub-contact region 227 and collector contact layer 228. In an embodiment, the sub-collector region 226 may have the same doping polarity as the SIC region 224 but may be doped at a higher doping concentration. In an embodiment, the doping concentration of the sub-collector region 226 may be in a range of about 5e18 cm$^{-3}$ to 1e21 cm$^{-3}$. In an embodiment, the sub-collector region 226 may be doped 10 to 100 times higher than the doping concentration of the collector region 220. According to an embodiment, the sub-collector region 226 may be doped at a level 100 to 1000 times higher concentration than the collector region 220. The sub-contact region 227 may have a doping concentration similar to the sub-collector region 226 but is positioned closer to the collector contact layer 228 to maintain a low resistance path from the collector region 220 to the collector contact layer 228.

In an embodiment, the intrinsic base region 230 may be formed over the collector region 220. The intrinsic base region 230 may include a base buffer region 232 (i.e., "first base region"), a base intermediate region 234 (i.e., "second base region"), disposed over and coupled to the base buffer region 232, and a base cap region 235 (i.e., "third base region") disposed over the base region 234. In an embodiment, the base intermediate region 234 may be formed over the base buffer region 232. In an embodiment, the intrinsic base region 230 may be formed laterally adjacent dielectric region 214 within the base cavity 231. In an embodiment, the intrinsic base region 230 may be formed using a p-type semiconductor (e.g., Si). In an embodiment, the intrinsic base region 230 may be doped with carbon (C). In other embodiments, the intrinsic base region 230 may be formed using a n-type semiconductor. In an embodiment, the base buffer region 232 may be formed using SiGe. The base buffer region 232 may be formed using Si or SiGe, according to an embodiment. In other embodiments, the base buffer region 232 may be formed using Si. In an embodiment, portions of the intrinsic base region 230 (e.g., base buffer region 232, base intermediate region 234, and base cap region 235) may be formed using $Si_{1-X}Ge_X$ where X is the Ge mole fraction. In an embodiment, a portion of the base intermediate region 234 may fill the base cavity 231 and contact the extrinsic base region 250 in a base link region 237. In an embodiment, portions of the intrinsic base region 230 formed in the base cavity 231, and a base link region 237 formed under the extrinsic base region 250 may be monocrystalline. In an embodiment, one or more portions of the intrinsic base region 230 may have a narrower bandgap than the intrinsic emitter region 261. In an embodiment, the bandgap of the one or more portions of the base intermediate region 234 may be adjusted by changes in the Ge mole fraction. In an embodiment, the base buffer region 232 and the base intermediate region 234 may have the same bandgap (e.g., same Ge mole fraction, X). In an embodiment, the Ge mole fraction, X, may vary between about 0.05 and about 0.3 though other larger or smaller values of X may be used. In an embodiment, the value of the Ge mole fraction may be constant throughout the intrinsic base region 230. In other embodiments, the base buffer region 232 may have a narrower bandgap than the base intermediate region 234. In still other embodiments, the bandgap of the intrinsic base region 230 may be continuously graded through both the base buffer region 232 and the base intermediate region 234. In these embodiments, the grading of the base material, e.g., $Si_{1-X}Ge_X$ may include forming base intermediate region 234 with a wider bandgap and continuously reducing to a narrower bandgap in the base buffer region 232. In an embodiment, the base buffer region 232 may have a thickness of between about 50 angstroms and 500 angstroms. In other embodiments, the base buffer region 232 may have a thickness between about 20 angstroms and about 2000 angstroms, though other thicknesses may be used. In an embodiment, the base intermediate region 234 may have a thickness of between about 20 angstroms and 200 angstroms. In other embodiments, the base intermediate region 234 may have a thickness between about 20 angstroms and about 2000 angstroms, though other thicknesses may be used. In an embodiment, the base cap region 235 may have a thickness of between about 50 angstroms and 200 angstroms. In other embodiments, the base cap region 235 may have a thickness between about 20 angstroms and about 2000 angstroms, though other thicknesses may be used. In an embodiment of a p-type base region, the base intermediate region 234 may be doped with one or more of C, B, O, or In though other dopant species may be used. In an embodiment of a n-type base region (e.g., a pnp transistor device), the base intermediate region 234 may be doped with one or more of P, Li, As, Sb though other dopant species may be used. In an embodiment, the base buffer region 232 may be undoped. In other embodiments, the base buffer region 232 may be doped with a low-doping concentration (e.g., between around 1e16 $cm^{-3}$ and about 1e18 $cm^{-3}$, although other higher or lower dopant concentrations may be used) and be doped as the same type as the collector region 220. In an embodiment, the doping concentration of the base intermediate region 234 may be in a range of about 5e17 $cm^{-3}$ to 1e20 $cm^{-3}$. In other embodiments, the doping concentration of the base intermediate region 234 may be in a range of about 1e17 $cm^{-3}$ to 1e21 $cm^{-3}$, though other higher or lower doping concentrations may be used. In an embodiment, the base cap region 235 may be undoped. In other embodiments, the base cap region 235 may be doped with the same type of dopant (i.e., n-type or p-type) as the base intermediate region 234 and may have a dopant concentration in a range of around 1e17 $cm^{-3}$ to around 1e18 $cm^{-3}$, although higher or lower dopant concentrations may be used.

In an embodiment, the extrinsic base region 250 may be formed over the semiconductor substrate 210 and may be coupled to the intrinsic base region 230 through a base link region 237 formed in the base cavity 231. In an embodiment, the extrinsic base region 250 may include monocrystalline silicon. In some embodiments, the extrinsic base region 250 may include silicon-germanium. In further embodiments, the extrinsic base region 250 may include alternating silicon and silicon germanium layers. The alternating silicon and germanium layers may form a superlattice structure, according to an embodiment. In embodiments that include a p-type intrinsic base region 230 (e.g., a npn transistor device), the extrinsic base region may be doped with one or more of p-type dopant(s) B, O, In or Al, though other dopant species may be used. In embodiments that include a n-type intrinsic base region 230 (e.g., a pnp transistor device), the extrinsic base region 250 may be doped with one or more of n-type dopant(s) such P, Li, As, or Sb, though other dopant species may be used. In an embodiment, the extrinsic base region 250 may include the same dopant species as the intrinsic base region 230. For example, the intrinsic base region 230 and the extrinsic base region 250 may both include B doping.

In an embodiment, the extrinsic base region 250 may include a monocrystalline region 254 formed over base link region 237 within the base cavity 231 and a polycrystalline region 256 formed in areas of the device adjacent the monocrystalline region 254, over the dielectric region 214. In an embodiment, a base electrode 259 may be coupled to extrinsic base region 250 in the polycrystalline region 256 through a base contact layer 258.

In an embodiment, a thickness of the extrinsic base region 250 may be between about 100 angstroms and 1500 angstroms although other thicknesses may be used. In an embodiment, the hole mobility of the extrinsic base region 250 in the monocrystalline region 254 may between about 100 $cm^2$/V-s and about 200 $cm^2$/V-s while the associated sheet resistance, $R_{sh}$, of the extrinsic base region 250 in the monocrystalline region 254 may be between about 30 ohms per square and about 60 ohms per square. In other embodiments, the mobility of the extrinsic base region 250 in the monocrystalline region 254 may between about 50 $cm^2$/V-s and about 300 $cm^2$/V-s, while the associated $R_{sh}$ of the extrinsic base region may be between about 20 ohms per square and about 120 ohms per square. The hole mobility of the extrinsic base region 250 in the polycrystalline region 256 may between about 30 $cm^2$/V-s and about 60 $cm^2$/V-s while the associated sheet resistance, $R_{sh}$, of the extrinsic base region 250 in the monocrystalline region 254 may be between about 200 ohms per square and about 900 ohms per square. In other embodiments, the mobility of the extrinsic base region 250 in the polycrystalline region 256 may between about 10 $cm^2$/V-s and about 100 $cm^2$/V-s, while the associated $R_{sh}$ of the extrinsic base region may be between about 80 ohms per square and about 1000 ohms per square.

In an embodiment, the emitter region 260 may be formed over the intrinsic base region 230. According to an embodiment, the emitter region 260 may include an intrinsic emitter region 261, a first emitter spacer layer 263, a second emitter spacer layer 264, extrinsic emitter region 265, and an emitter contact layer 268 formed over the intrinsic emitter region 261. The emitter region 260 may also include an emitter electrode 269 formed over the emitter contact layer 268, according to an embodiment.

In an embodiment, the intrinsic emitter region 261 may be formed over the intrinsic base region 230, the second emitter spacer layer 264, the first emitter spacer layer 263. In an embodiment, the intrinsic emitter region 261 may be formed using a monocrystalline n-type semiconductor. In other embodiments, the intrinsic emitter region 261 may be formed using a p-type semiconductor. In an embodiment, the intrinsic emitter region 261 may have a thickness of between about 100 angstroms and 1000 angstroms. In other embodiments, the intrinsic emitter region 261 may have a thickness of between about 50 angstroms and about 5000 angstroms, though other thicknesses may be used. In an embodiment that includes a p-type emitter region 260 (e.g., a pnp transistor device), the intrinsic emitter region 261 may be monocrystalline and be doped with one or more of B, O, Al, or In though other dopant species may be used. In an embodiment of an n-type emitter region (e.g., a npn transistor device), the intrinsic emitter region 261 may be doped with one or more of P, Li, As, or Sb though other dopant species may be used. In an embodiment, the doping concentration of the intrinsic emitter region 261 may be in a range of about 5e17 cm$^{-3}$ to 5e21 cm$^{-3}$.

The extrinsic emitter region 265 may be coupled to the intrinsic emitter region 261, the second emitter spacer layer 264, the first emitter spacer layer 263, and emitter dielectric stack 262. In an embodiment, the extrinsic emitter region 265 may be formed using a polycrystalline n-type semiconductor. In other embodiments, the extrinsic emitter region 265 may be formed using a p-type semiconductor. In an embodiment, the extrinsic emitter region 265 may have a thickness of between about 100 angstroms and 1000 angstroms. In other embodiments, the extrinsic emitter region 265 may have a thickness of between about 50 angstroms and about 5000 angstroms, though other thicknesses may be used. In an embodiment that includes a p-type emitter region 260 (e.g., a pnp transistor device), the extrinsic emitter region 265 may be polycrystalline and be doped with one or more of B, O, Al, or In though other dopant species may be used. In an embodiment of an n-type emitter region (e.g., a npn transistor device), the extrinsic emitter region 265 may be doped with one or more of P, Li, As, or Sb though other dopant species may be used. In an embodiment, the doping concentration of the extrinsic emitter region 265 may be in a range of about 5e17 cm-3 to 5e21 cm-3.

According to an embodiment, the emitter contact layer 268 may be formed over the intrinsic emitter region 261. In an embodiment, the emitter contact layer 268 may be formed using titanium-tungsten (TiW), titanium tungsten nitride (TiWN), tungsten silicide (WSi), cobalt silicide (CoSi), platinum silicide (PtSi), nickel platinum silicide (NiPtSi), or other suitable material(s). The emitter electrode 269 may be formed over the emitter contact layer 268, according to an embodiment. In an embodiment, the emitter electrode 269 may be formed from one of copper, aluminum, tungsten, or other suitable conducting materials.

Figure 3:
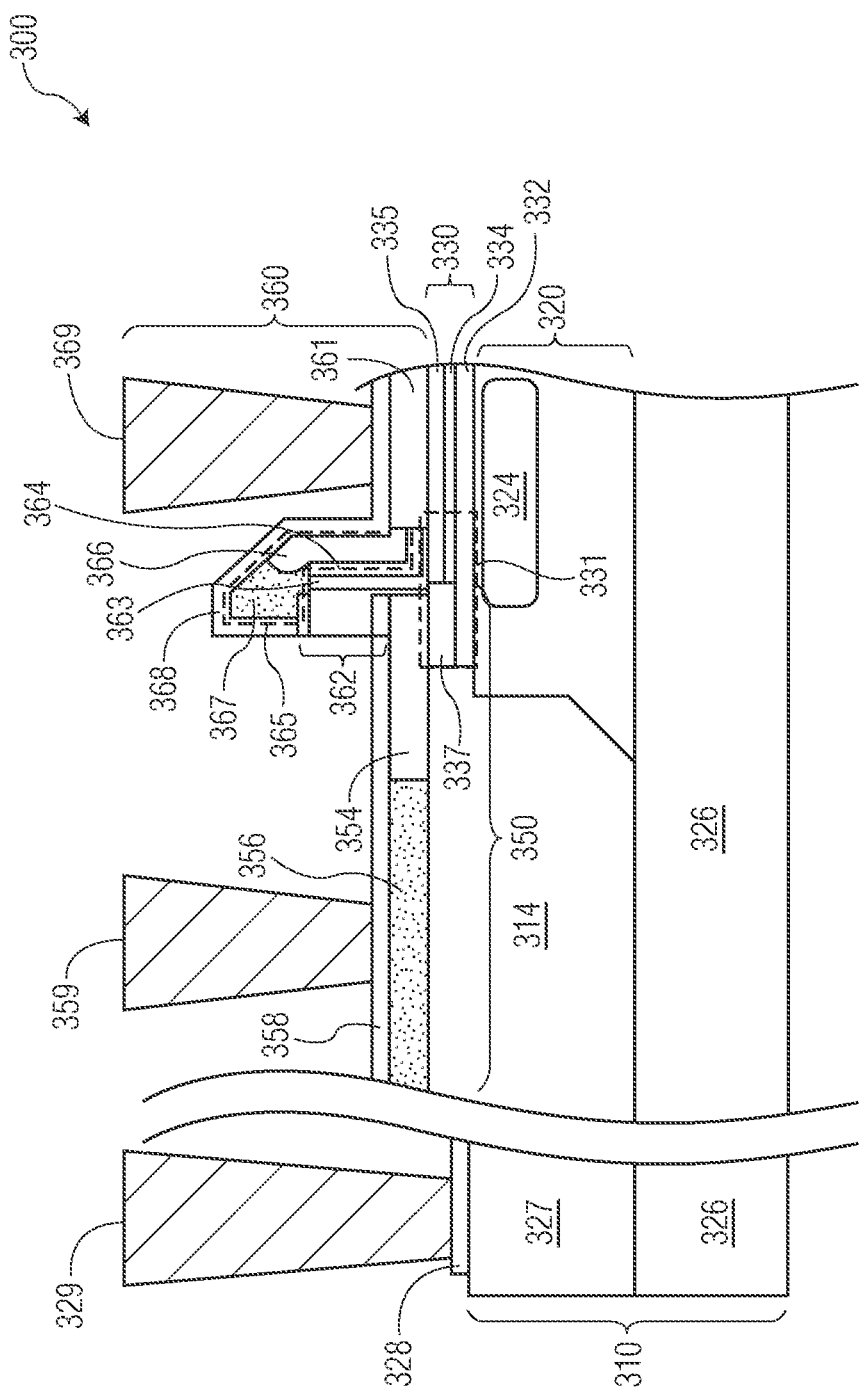
FIG. 3 is a cross sectional side view of a semiconductor device in accordance with an embodiment.

FIG. 3 depicts a further embodiments of bipolar transistor devices with extrinsic bases having monocrystalline regions. FIG. 3 is a cross sectional side view of an exemplary bipolar transistor device 300, according to an embodiment. In this embodiment a first extrinsic portion 366 of the extrinsic portion of the emitter region 360 is monocrystalline The numbered drawings in FIG. 3 have like numbering and may be compared to the description and reference numbers associated with FIG. 2. For example, the semiconductor substrate 210 in FIG. 2 correspond to the semiconductor substrate 310 in FIG. 3. Also, for the sake of brevity, descriptions of numbered references and fabrication details associated with each numbered item may not be repeated where adequate descriptions were given in connection with the descriptions of FIG. 2.

The bipolar transistor device 300 may include a semiconductor substrate 310 that includes semiconductor regions to define a collector region 320, an intrinsic base region 330, an extrinsic base region 350, and an emitter region 360, as described above. A number of other components of the bipolar transistor device 300 may be configured in a manner similar to the bipolar transistor device 200 of FIG. 2. For example, the semiconductor substrate 310 and its associated semiconductor regions (e.g., dielectric region 314, collector region 320, SIC 324, sub-collector 326, sub-contact region 327, collector contact layer 328, collector electrode 329, intrinsic base region 330, base cavity 331, base buffer region 332, base intermediate region 334, base cap layer 335, extrinsic base region 350, monocrystalline region 354, polycrystalline portion 356, base contact layer 358, base electrode 359, intrinsic emitter region 361, emitter dielectric layer stack 362, emitter contact layer 368, and emitter contact 369) may be formed in a similar manner as like-numbered components of bipolar transistor device 200 of FIG. 2.

Referring again to FIG. 3, an extrinsic emitter region 365 of the emitter region 360 may be formed over emitter spacer layers 363, 364. A first extrinsic portion 366 of the extrinsic emitter region 365 of the emitter region 360 may in include a monocrystalline material. A second portion 367 of the extrinsic portion may include a polycrystalline material.

Figure 4A:
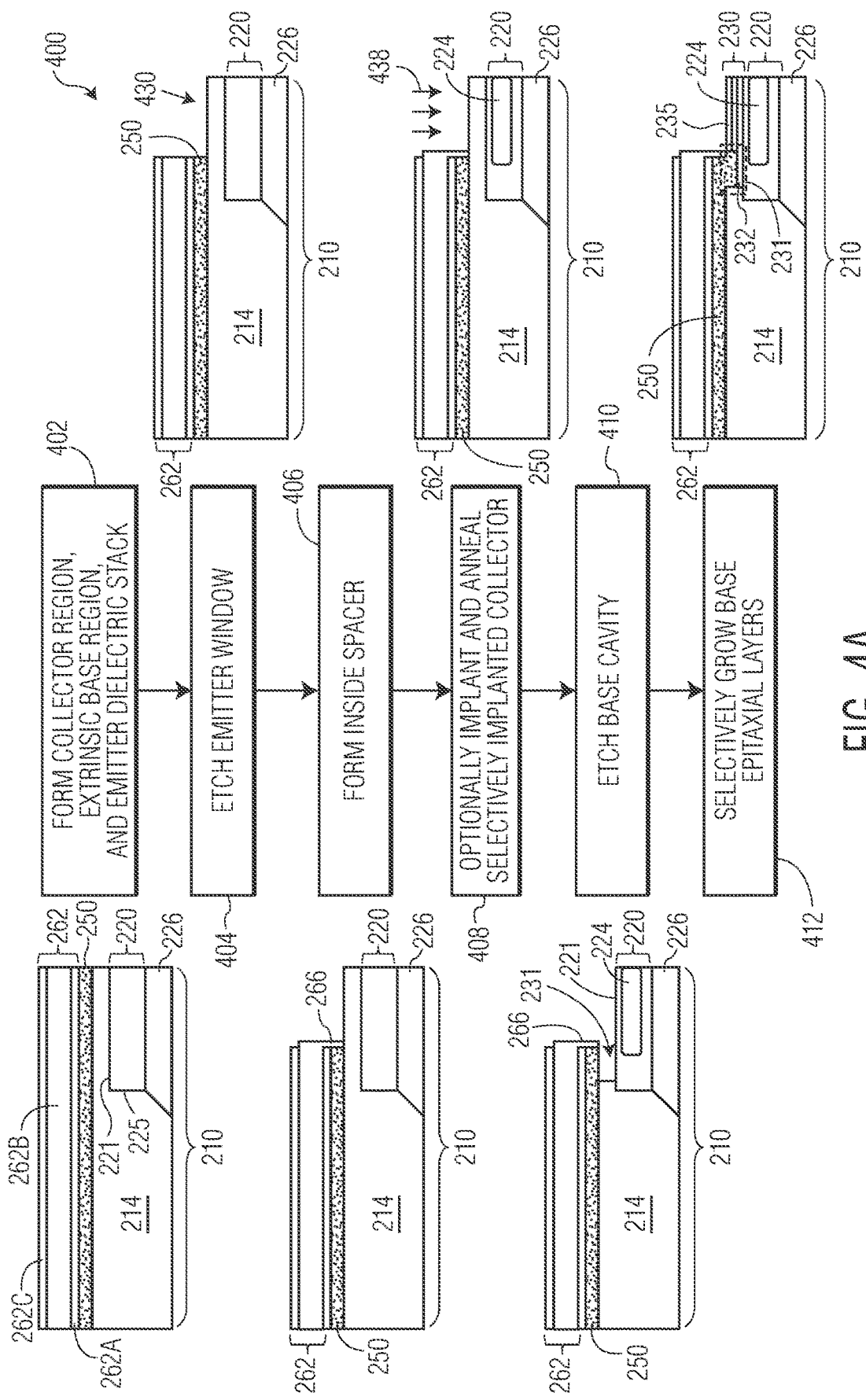
Figure 4C:
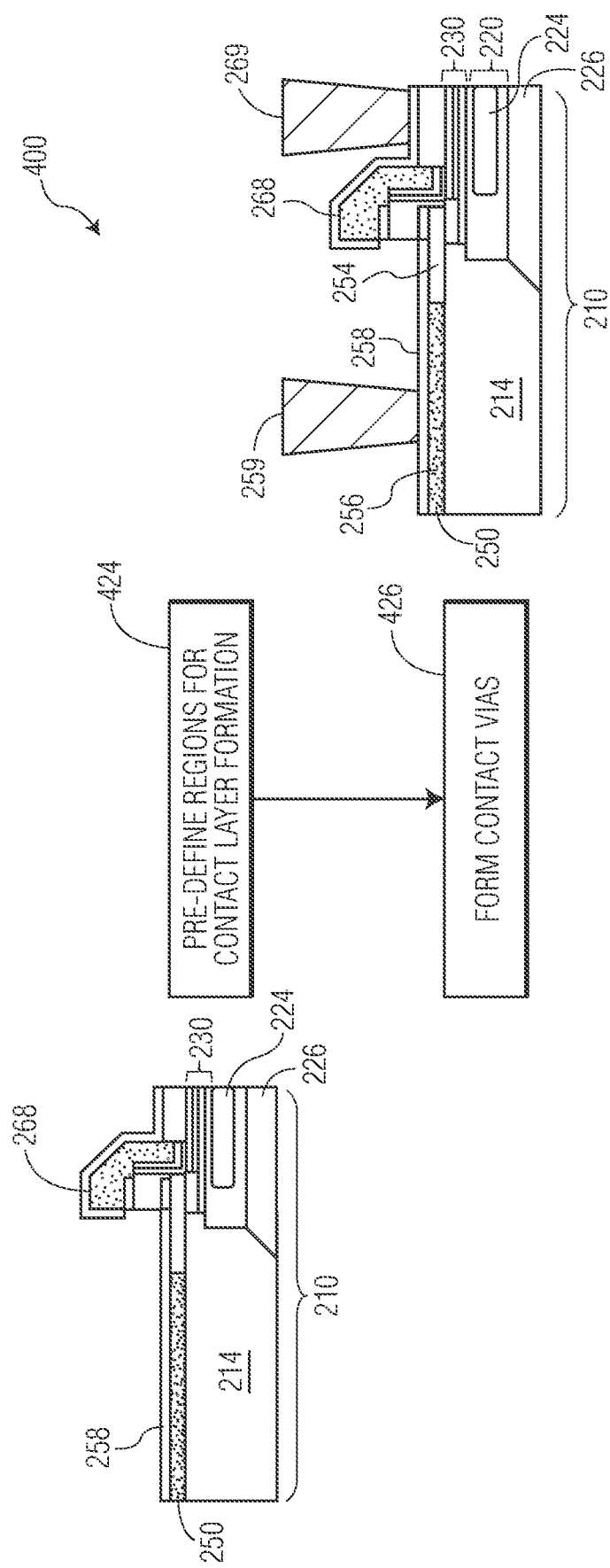

FIGS. 4A, 4B, and 4C depict process flow diagrams alongside corresponding cross-sectional views detailing partial formation of an area 4 of FIG. 2, and describing a method 400 for fabricating the bipolar transistor device 200 of FIG. 2, in accordance with an embodiment. References to optional process steps to realize the bipolar transistor device 300 of FIG. 3 have been added, where appropriate. In an embodiment, the method 400 includes a sequence of steps, for which only the salient are shown for convenience in illustration. For example, the method 400 may include a number of acts directed to preparing the semiconductor substrate for the fabrication method that are not described in detail herein. The ordering of the acts may vary in other embodiments.

Referring to FIG. 4A, in block 402, an embodiment of the method 400 may include forming a collector region 220 within a semiconductor substrate 210, forming a sub-collector region 226, forming a dielectric region 214 adjacent the collector region 220, forming extrinsic base region 250, and forming emitter dielectric stack 262, according to an embodiment. In an embodiment, forming the sub-collector region 226 may include implanting a dopant species (e.g., phosphorus) using ion implantation (not shown). Forming the collector region 220 may include using dry or wet etching to form a collector mesa defined by collector sidewall 225. In an embodiment, a dielectric material (e.g., SiO$_2$ or TEOS) may be deposited around the collector sidewall 225 and over the upper surface 221 of the collector to form a dielectric region 214 for, e.g., shallow trench isolation (STI) to provide isolation between adjacent devices. In an embodiment, the dielectric region 214 may be formed using plasma enhanced chemical vapor phase deposition (PECVD), low pressure chemical vapor phase deposition (LPCVD), chemical vapor phase deposition (CVD), thermal growth techniques, or other suitable deposition techniques.

Referring again to FIG. 4A, in block 402, the method may include forming a collector region 220 within a semiconductor substrate 210, forming dielectric region 214 over the collector region 220, forming extrinsic base region 250 over the collector region 220, and forming the emitter stack region over the extrinsic base region 250, according to an embodiment. In an embodiment, the collector region 220 may be formed by first, implanting the sub-collector region 226 by implanting a dopant species (e.g., arsenic) using ion implantation (not shown).

Forming the collector region 220 may be continued by using dry or wet etching to form a collector mesa. In an embodiment, a dielectric material (e.g., TEOS) may be deposited around the collector mesa defined by collector sidewall 225 to form the dielectric region 214 for, e.g., shallow trench isolation (STI) to provide isolation between adjacent devices.

In an embodiment, the extrinsic base region 250 may be formed using, e.g., polysilicon and may be grown using MOCVD, CVD, LPCVD, PECVD, or other suitable techniques. In an embodiment, the extrinsic base region 250 may be doped with a suitable dopant (e.g., B doping for a npn transistor). In an embodiment, the extrinsic base region may between about 500 angstroms thick and about 1000 angstroms thick, though other thicknesses may be used. In another embodiment, the extrinsic base region 250 may between about 100 angstroms thick and about 1500 angstroms thick, though other thicknesses may be used.

In an embodiment, forming the emitter dielectric stack 262 may include forming a first dielectric layer 262A (e.g., tetraethyl orthosilicate (TEOS)) over the collector region 220, forming a second dielectric layer 262B (e.g., silicon nitride (SiN)) over the first dielectric layer 262A, and forming a third dielectric layer 262C (e.g., TEOS) over the second dielectric layer 262B. Each of the first dielectric layer 262A, the second dielectric layer 262B, and the third dielectric layer 262C may include a portion disposed over the collector region 220, according to an embodiment. In an embodiment, each of the layers of the emitter dielectric stack 262 may be formed using plasma enhanced chemical vapor phase deposition (PECVD), low pressure chemical vapor phase deposition (LPCVD), chemical vapor phase deposition (CVD), thermal growth techniques, or other suitable deposition techniques. For example, LPCVD may be used to form SiN layers and PECVD may be used to form TEOS layers, according to an embodiment. In an embodiment, the first dielectric layer 262A (e.g., oxide) may between about 20 angstroms thick and about 200 angstroms thick, though other thicknesses may be used. In an embodiment, the second dielectric layer 262B (e.g., nitride) may between about 20 angstroms thick and about 200 angstroms thick, though other thicknesses may be used. In an embodiment, the third dielectric layer 262C (e.g., oxide) may between about 20 angstroms thick and about 200 angstroms thick, though other thicknesses may be used.

Referring now to FIG. 4A, block 404, an embodiment of the method 400 may include etching emitter dielectric stack 262 to form the emitter window 430. According to an embodiment of the method, the first, second, and third dielectric layers 262A, 262B, 262C may be etched using one or more wet and dry etches (not shown). In an embodiment, the wet etches may be accomplished using buffered oxide etch (a mixture of ammonium fluoride and hydrofluoric acid), hydrofluoric acid, or other suitable wet chemistries. The dry etches may be accomplished using sulfur hexafluoride, carbon tetrachloride, boron trichloride gases in a plasma etching system. Plasma etching may be accomplished using reactive ion etching (RIE), inductively coupled plasma (ICP) etching, or other suitable etch techniques. In an embodiment, wet etching may be used to remove oxide-based films (e.g., TEOS and other oxides) while nitride-based films (e.g., SiN and other nitrides) may be etched with F-based dry etching. In another embodiment, dry etching may be used to remove both the oxide and nitride films. In an embodiment, the extrinsic base region 250 may be etched using dry or wet chemistries (e.g., hydrobromic acid (HBr) and chlorine (Cl)-based etching). In an embodiment, the emitter window etch may stop on the dielectric region 214 over the collector region 220.

Referring to FIG. 4A, block 406, and in an embodiment, the first inside spacer layer 266 may be formed using, e.g., SiN and the dielectric deposition methods described above (e.g., PECVD, LPCVD, thermal deposition). In an embodiment, the first inside spacer may between about 50 angstroms and about 400 angstroms in thickness.

Referring to FIG. 4A, block 408, an embodiment of the method 400 may optionally include implanting collector region 220 to form the SIC region 224, according to an embodiment. According to an embodiment, implanting the collector region 220 may include ion implantation to incorporate a dopant species into the collector region 220. A SIC implant may be used to form the SIC region 224 In an embodiment, a dopant species 438 (e.g., phosphorous or arsenic) may be implanted to form the SIC region 224. In other embodiments (not shown), the SIC region 224 may be replaced with an epitaxially grown region, formed using epitaxial growth such as metal organic chemical vapor phase epitaxy (MOCVD), chemical vapor phase epitaxy (CVD), molecular beam epitaxy (MBE), or other suitable methods.

Referring to FIG. 4A, block 410, an embodiment of the method 400 may include etching base cavity 231, according to an embodiment. In an embodiment, forming base cavity 231 may include etching dielectric region 214, according to an embodiment. The base cavity 231 may be formed by wet etching the dielectric region 214 using isotropic wet and/or dry etching performed using one of the techniques described above. In an embodiment, the base cavity etch may expose an upper surface 221 of the collector region 220.

Referring to FIG. 4A, block 412, an embodiment of the method 400 may include forming intrinsic base region 230, according to an embodiment. In an embodiment, the base buffer region 232 may be formed using selective epitaxial growth over the exposed surface of collector region 220. In an embodiment, CVD or MOCVD may be used to epitaxially grow the base buffer region 232 using selective epitaxial growth. In an embodiment, the selective epitaxial growth may be facilitated by allowing the epitaxial material to only nucleate on the exposed semiconductor regions (e.g., the collector region 220 and the exposed bottom of extrinsic base region 250 within base cavity 231). The epitaxial material may not nucleate on and grow over the surrounding insulator areas. In an embodiment, the base buffer region 232 may be formed on the exposed collector region surface and fill the base cavity 231 to the extent that the commensurate portion of dielectric region 214 has been removed. In an embodiment, the base intermediate region 234 may be formed over the base buffer region 232 using similar selective epitaxial growth techniques as for forming the base buffer region 232. The base cap region 235 may be formed over the base intermediate region 234 using similar selective epitaxial growth techniques as for forming the base buffer region 232 and base intermediate region 234, according to an embodiment.

Referring to FIG. 4B, block 414, an embodiment of the method 400 may include forming first and second emitter spacer layers 263, 264 according to an embodiment. Emitter spacer layers 263, 264 may be formed by depositing dielectric layers inside the emitter window 430 and utilizing anisotropic vertical etching to remove the dielectric over the intrinsic base region 230 while leaving the dielectric layers on the sidewalls of the emitter window 430. In an embodiment, the first emitter spacer layer 263 (described previously) may include, e.g., TEOS and the second emitter spacer layer 264 may include, e.g., SiN, though other materials may be used. In an embodiment, the first emitter spacer layer 263 (e.g., oxide) may between about 20 angstroms thick and about 200 angstroms thick, though other thicknesses may be used. In an embodiment, the second emitter spacer layer 264 (e.g., SiN) may between about 20 angstroms thick and about 300 angstroms thick, though other thicknesses may be used.

Referring to FIG. 4B, block 416, an embodiment of the method 400 may include forming emitter region 260, according to an embodiment. Following spacer formation, the intrinsic emitter region 261 and extrinsic emitter region 265 may be formed. In an embodiment, CVD or MOCVD may be used to epitaxially grow the intrinsic emitter region 261 over intrinsic base region 230 and emitter dielectric stack 262 using selective epitaxial growth. In an embodiment, the intrinsic emitter region 261 may be monocrystalline and the extrinsic emitter region 265 may be polycrystalline. A resist layer 460 may be formed over the intrinsic emitter region 261 and the extrinsic emitter region 265 and may be used to mask the etching of the emitter region within opening 462. Etching of the extrinsic emitter region 265 may use techniques analogous to etching the extrinsic base region 250 and, for the sake of brevity, are not repeated here. Second and third dielectric layers 262B and 262C of emitter dielectric stack 262 may be etched during and after etching of collector region 220.

Referring to FIG. 4B, block 418, an embodiment of the method 400 may include creating an opening 462 in resist layer 460 and performing an pre-amorphization implant 464 of regions of extrinsic base region 250. In an embodiment, performing the pre-amorphization implant 464 may include implanting Ge or other suitable species such as Ar, Xe, Si into the extrinsic base region 250. The pre-amorphization implant 464 may include a dose of between about 1e14 $cm^{-2}$ and 1e16 $cm^{-2}$ at an energy of between about 10 keV and about 30 keV, according to an embodiment. In other embodiments where heavier species, e.g., Ar or Xe are used, the energy may be 100 keV or higher, according to an embodiment. In an embodiment, angularly disposed portions 465 of the pre-amorphization implant 464 may penetrate the extrinsic base region 250, base link region 237, and region 466 of intrinsic base region 230 and may render portions of the extrinsic base region 250, base link region 237, and region 466 of the intrinsic base region 230 amorphous.

Referring to FIG. 4B, block 420, an embodiment of the method 400 may optionally include performing an pre-amorphization implant 464 wherein extrinsic base region 350 and exposed regions of emitter region 360 as in the embodiment of bipolar transistor device 300 of FIG. 3. In this embodiment, resist layer may not be used to shield the emitter region 260 from the pre-amorphization implant 464. The pre-amorphization implant 464 may use the same conditions for the pre-amorphization implant described in connection with block 418 of the method 400. In an embodiment, angularly disposed portions 465 of the pre-amorphization implant 464 may penetrate second portions 367 of the extrinsic emitter region and base link region 337 and portion of base intermediate region 334 in region 466 and may render monocrystalline region 354 of the extrinsic base region 350 and second portion 367 of the extrinsic emitter region 365 amorphous.

Referring to FIG. 4B, block 422, an embodiment of the method 400 may include using solid-phase regrowth to convert portions of the extrinsic base regions 250, 350 to a monocrystalline regions 254, 354 in embodiments of bipolar transistor devices 200, 300 of FIGS. 2, 3. In an embodiment, the solid phase regrowth may include heating the amorphous regions to a temperature of between 500 degrees Celsius and 700 degrees Celsius with an ambient condition that includes a pressure between about 1 milli Torr and 800 Torr. The time needed to convert portions of the extrinsic base region 250 and 350 and base link regions 237, 337 to monocrystalline regions 254, 354 may be between about 1 minute and 20 hours, depending on the temperature used, according to an embodiment. In other embodiments, a laser melt process may be used to accomplish the solid-phase regrowth wherein laser energy is scanned over the wafer and heats the amorphous portions of the extrinsic base regions 250, 350 convert it to monocrystalline regions 254 and 354 as well as first extrinsic portion 366 of the extrinsic emitter region 365.

Referring to FIG. 4C, block 424, an embodiment of the method 400 may include defining regions for emitter contact layer 268, base contact layer 258, and collector contact layer 228 (not shown), according to an embodiment. Base contact layer 258 and emitter contact layer 268 may be formed using, e.g., a silicide process, over extrinsic base region 250, according to an embodiment. Collector contact layer 228 and collector electrode 229 may be formed at the same time as base and emitter contact layers 258, 268 and base and emitter contacts and 259, 269 (not shown). Following this, other processing may follow, depending on the device application and requirements (not shown).

Referring to FIG. 4C, block 426, an embodiment of the method may include forming emitter electrode 269, base electrode 259, and collector electrode 229, according to an embodiment. In an embodiment, base and emitter electrodes 259 and 269, may be formed over base contact layer 258 and emitter contact layer 268, according to an embodiment. In an embodiment, base and emitter electrodes 259, 269 may be formed using, e.g., Ti/Tin/W metallization deposited by, e.g., CVD.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary, or an example is not necessarily to be construed as preferred or advantageous over other implementations. Furthermore, there is no intention to be bound by any expressed or implied theory presented in the preceding technical field, background, or the following detailed description.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
   a semiconductor substrate;
   a collector region having a first width formed within the semiconductor substrate, the collector region having an upper surface and a collector sidewall;
   an intrinsic base region formed from monocrystalline material having a second width, disposed over the collector region, wherein the first width is greater than the second width;
   an extrinsic base region having an upper surface and formed over the collector region and electrically coupled to the intrinsic base region, wherein the extrinsic base region includes a monocrystalline region coupled to the intrinsic base region and a polycrystalline region coupled to the monocrystalline region, wherein at least a portion of the monocrystalline region is formed above and laterally outside the intrinsic base region formed from monocrystalline material; and
   an emitter region formed over the intrinsic base region;
   wherein a portion of the intrinsic base region is formed in a base cavity formed over the collector region and under the extrinsic base region.

2. The semiconductor device of claim 1, wherein a contact layer is formed above the extrinsic base region.

3. The semiconductor device of claim 2, wherein a portion of the monocrystalline region is formed under the contact layer.

4. The semiconductor device of claim 1, wherein a portion of a base link region formed within the base cavity is monocrystalline and is coupled to the monocrystalline region of the extrinsic base region.

5. The semiconductor device of claim 1, wherein an extrinsic portion of the emitter region is formed over an emitter spacer layer, and wherein a portion of the extrinsic portion of the emitter region is monocrystalline.

6. The semiconductor device of claim 1, wherein a portion of the intrinsic base region includes selective epitaxy.

7. The semiconductor device of claim 1, wherein a portion of the intrinsic base region includes silicon germanium.

8. A bipolar transistor device comprising:
   a semiconductor substrate;
   a first isolation region formed within the semiconductor substrate;
   a collector region having a first width formed within the semiconductor substrate, the collector region having an upper surface and a collector sidewall;
   an intrinsic base region having a second width, disposed over the collector region, wherein the first width is greater than the second width;
   a dielectric region formed over at least a portion of the semiconductor substrate and over the collector sidewall;
   an intrinsic base region having a second width, disposed over the collector region, wherein the first width is greater than the second width;
   an extrinsic base region having an upper surface and formed over the collector region and electrically coupled to the intrinsic base region, wherein the extrinsic base region includes a monocrystalline region coupled to the intrinsic base region and a polycrystalline region coupled to the monocrystalline region, wherein at least a portion of the monocrystalline region is formed above and laterally outside the intrinsic base region formed from monocrystalline material; and
   an emitter region formed over the intrinsic base region;
   wherein a portion of a base link region formed within the base cavity is monocrystalline and is coupled to the monocrystalline region of the extrinsic base region.

9. The bipolar transistor device of claim 8, wherein a portion of the intrinsic base region is formed in a base cavity over the collector region and under the extrinsic base region.

10. The bipolar transistor device of claim 8, wherein an extrinsic portion of the emitter region is formed over an emitter spacer layer, and wherein a portion of the extrinsic portion of the emitter region is monocrystalline.

11. A method of forming a bipolar transistor device, the method comprising:
    forming an isolation region within a semiconductor substrate;
    forming a collector region having a first width laterally adjacent the isolation region within the semiconductor substrate, wherein the collector region includes an upper surface and a collector sidewall;
    forming an intrinsic base region having a second width over the collector region, wherein the first width is greater than the second width;
    forming a dielectric region over at least a portion of the semiconductor substrate and over the collector sidewall;
    forming an extrinsic base region having an upper surface and formed over the collector region and electrically coupled to the intrinsic base region, wherein the extrinsic base region includes a monocrystalline region coupled to the intrinsic base region and a polycrystalline region coupled to the monocrystalline region, wherein at least a portion of the monocrystalline region is formed above and outside the intrinsic base region formed from monocrystalline material;
    forming a base cavity and forming the intrinsic base region and a base link region in the base cavity, wherein a portion of the base link region is monocrystalline; and
    forming an emitter region over the intrinsic base region.

12. The method of claim 11, wherein forming an emitter region over the intrinsic base region includes forming an extrinsic portion of the emitter region over an emitter spacer layer, and wherein a portion of the extrinsic portion of the emitter region is monocrystalline.

13. The method of claim 11, further comprising forming a contact layer above the extrinsic base region, wherein forming the contact layer includes forming a portion of the contact layer over the monocrystalline region.

14. A method of forming a bipolar transistor device, the method comprising:
    forming an isolation region within a semiconductor substrate;
    forming a collector region having a first width laterally adjacent the isolation region within the semiconductor substrate, wherein the collector region includes an upper surface and a collector sidewall;

forming an intrinsic base region having a second width over the collector region, wherein the first width is greater than the second width;

forming a dielectric region over at least a portion of the semiconductor substrate and over the collector sidewall;

forming an extrinsic base region having an upper surface and formed over the collector region and electrically coupled to the intrinsic base region, wherein the extrinsic base region includes a monocrystalline region coupled to the intrinsic base region and a polycrystalline region coupled to the monocrystalline region, wherein forming the monocrystalline region includes performing a pre-amorphization implant; and forming an emitter region over the intrinsic base region.

15. The method of claim 14, wherein forming the monocrystalline region includes solid-phase regrowth.

16. The method of claim 11, further comprising forming an emitter spacer layer and forming an extrinsic portion of the emitter region over the emitter spacer layer.

17. The method of claim 16, wherein forming the extrinsic portion of the emitter region includes forming a monocrystalline material within the extrinsic portion of the emitter region.

18. The method of claim 14, wherein forming an emitter region over the intrinsic base region includes forming an extrinsic portion of the emitter region over an emitter spacer layer, and wherein a portion of the extrinsic portion of the emitter region is monocrystalline.

19. The method of claim 14, further comprising forming a contact layer above the extrinsic base region, wherein forming the contact layer includes forming a portion of the contact layer over the monocrystalline region.

20. The method of claim 14, further comprising forming an emitter spacer layer and forming an extrinsic portion of the emitter region over the emitter spacer layer, wherein forming the extrinsic portion of the emitter region includes forming a monocrystalline material within the extrinsic portion of the emitter region.

* * * * *